(12) United States Patent
Wang

(10) Patent No.: US 9,472,278 B2
(45) Date of Patent: Oct. 18, 2016

(54) VOLTAGE GENERATOR, OSCILLATION DEVICE AND OPERATION METHOD

(71) Applicant: Nuvoton Technology Corporation, Hsinchu (TW)

(72) Inventor: Cheng-Chih Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 14/501,049

(22) Filed: Sep. 30, 2014

(65) Prior Publication Data

US 2015/0194928 A1    Jul. 9, 2015

(30) Foreign Application Priority Data

Jan. 8, 2014   (TW) .............................. 103100669 A

(51) Int. Cl.
*G11C 13/00*      (2006.01)
*H03K 3/03*       (2006.01)

(52) U.S. Cl.
CPC ......... *G11C 13/0069* (2013.01); *H03K 3/0315* (2013.01); *G11C 13/0002* (2013.01); *G11C 13/0038* (2013.01); *G11C 2013/0045* (2013.01)

(58) Field of Classification Search
CPC .......... G11C 13/0069; G11C 13/0038; G11C 2013/0045; G11C 13/0002; H03K 3/0315
USPC ....... 331/57, 177 R, 185, 186; 365/100, 148, 365/158, 159, 242
See application file for complete search history.

(56) References Cited

U.S. PATENT DOCUMENTS

| | | | |
|---|---|---|---|
| 5,670,915 A | 9/1997 | Cooper et al. | |
| 7,151,689 B2 | 12/2006 | Baker | |
| 7,609,121 B2 | 10/2009 | Feng et al. | |
| 7,898,890 B2 * | 3/2011 | Tomita | G11C 11/406 365/189.17 |
| 8,081,504 B2 | 12/2011 | Chen et al. | |
| 8,113,437 B2 | 2/2012 | Kang | |
| 8,115,188 B2 | 2/2012 | Gosain et al. | |
| 8,270,226 B2 | 9/2012 | Choi et al. | |
| 8,368,472 B2 | 2/2013 | Nakamura et al. | |
| 8,477,055 B2 | 7/2013 | Choi et al. | |
| 8,589,764 B2 | 11/2013 | Takeuchi et al. | |
| 8,635,511 B2 | 1/2014 | Takeuchi et al. | |
| 2012/0042200 A1 | 2/2012 | Takeuchi et al. | |
| 2012/0303870 A1 | 11/2012 | Park et al. | |

(Continued)

FOREIGN PATENT DOCUMENTS

| | | |
|---|---|---|
| CN | 101478031 | 7/2009 |
| CN | 102169719 | 8/2011 |

(Continued)

OTHER PUBLICATIONS

"Office Action of Taiwan Counterpart Application", issued on Jun. 17, 2015, p. 1-p. 6.

(Continued)

*Primary Examiner* — Richard Tan
(74) *Attorney, Agent, or Firm* — Jianq Chyun IP Office

(57) ABSTRACT

A voltage generator and an oscillation device, and an operation method thereof are disclosed. The oscillation device includes a non-volatile memory, the voltage generator and a voltage-controlled oscillation (VCO) circuit. The voltage generator uses the non-volatile resistance provided by a non-volatile memory to generate a bias voltage. The VCO circuit is coupled to the voltage generator so as to generate a corresponding oscillation frequency based on the bias voltage.

16 Claims, 7 Drawing Sheets

(56) References Cited

U.S. PATENT DOCUMENTS

| | | | |
|---|---|---|---|
| 2013/0027079 A1 | 1/2013 | Nazarian et al. | |
| 2013/0027081 A1 | 1/2013 | Nazarian et al. | |
| 2013/0300509 A1* | 11/2013 | Kim | H03K 3/0315 331/34 |

FOREIGN PATENT DOCUMENTS

| CN | 102412827 | 4/2012 |
|---|---|---|
| KR | 101031420 | 4/2011 |
| KR | 20110057839 | 6/2011 |
| TW | 201333953 | 8/2013 |

OTHER PUBLICATIONS

"Office Action of Taiwan Counterpart Application", issued on Jan. 12, 2016, p. 1-p. 8.

* cited by examiner

VOLTAGE GENERATOR, OSCILLATION DEVICE AND OPERATION METHOD

CROSS-REFERENCE TO RELATED APPLICATION

This application claims the priority benefit of Taiwan application serial no. 103100669, filed on Jan. 8, 2014. The entirety of the above-mentioned patent application is hereby incorporated by reference herein and made a part of this specification.

BACKGROUND

1. Field of the Invention

The embodiments of present invention are directed to an electronic device and an operation method thereof. More particularly, the embodiments of present invention are directed to a voltage generator, an oscillation device and an operation method thereof.

2. Description of Related Art

A voltage-controlled oscillator (VCO) circuit is an electronic oscillator circuit serving to control an oscillation frequency based on an input voltage. The oscillation frequency of the VCO circuit varies with different levels of the input voltage. Nevertheless, in a conventional VCO circuit, when an operation power is failed, related parameters (e.g., the oscillation frequency and so on) that are already calibrated will also be lost, and the oscillation frequency of the VCO circuit has to be reset and refine-tuned by a user (or a system) after the conventional VCO circuit is re-started (re-powered on).

SUMMARY

According to an embodiment of the invention, an oscillation device including at least one non-volatile memory, a voltage generator and a voltage-controlled oscillation (VCO) circuit is provided. The voltage generator generates a bias voltage by using a non-volatile resistance provided by the non-volatile memory. The VCO circuit is coupled to the voltage generator and configured to generate a corresponding oscillation frequency based on the bias voltage.

According to an embodiment of the invention, a voltage generator including a current source and a non-volatile memory is provided. A first terminal and a second ten final of the non-volatile memory are respectively coupled to the current source and a low-level voltage. The non-volatile memory has a non-volatile resistance determined by a programming process, and generates a bias voltage in accordance with the non-volatile resistance and the current source.

According to an embodiment of the invention, an operation method of a VCO circuit is provided, which includes the following steps. A non-volatile resistance is provided by at least one non-volatile memory. A bias voltage is generated to the VCO circuit by using the non-volatile resistance. The non-volatile resistance of the non-volatile memory is set to adjust the bias voltage so as to control the VCO circuit to generate a corresponding oscillation frequency based on the bias voltage.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
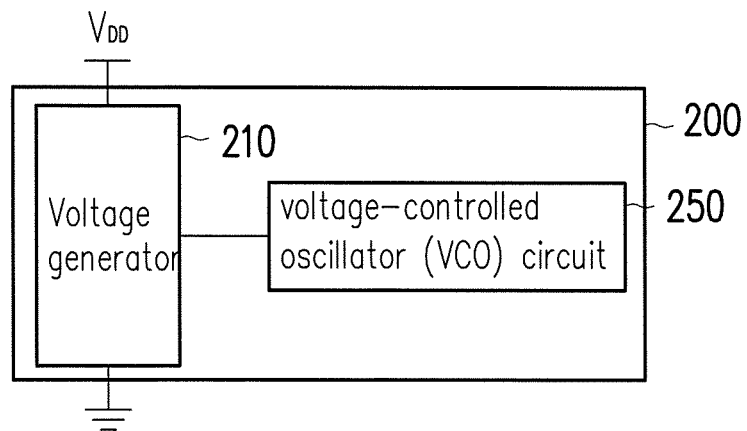
FIG. 1 is a schematic circuit block diagram of an oscillation device according to an embodiment of the invention.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a schematic circuit block diagram of an oscillation device according to an embodiment of the invention. The oscillation device 200 can be disposed in a microcontroller. Referring to FIG. 1, an oscillation device 200 may include a voltage generator 210 and a voltage-controlled oscillation (VCO) circuit 250. In the present embodiment, a control voltage level of the VCO circuit 250 is generated by the voltage generator 210. The voltage generator 210 may use a non-volatile resistance provided by at least one non-volatile memory (NVM) to generate a bias voltage (which is equal to the control voltage level). The at least one non-volatile memory in the voltage generator 210 may be a resistive random access memory (RRAM), a phase-change random access memory (PCRAM) or any other memory capable of implementing the embodiment of the invention.

Under the control of the control voltage level, the VCO circuit 250 may oscillate at a specific frequency based on the bias voltage. In order to conveniently adjust an oscillation frequency of the VCO circuit 250, the voltage generator 210 may provide an adjustment mechanism for adjusting the control voltage level and correspondingly adjusting the oscillation frequency of the VCO circuit 250 by using the control voltage level. For instance, the non-volatile resistance of the non-volatile memory in the voltage generator 210 may be determined by a programming process utilizing a digital signal, and the bias voltage provided to the VCO circuit 250 is generated in accordance with the non-volatile resistance and a current source. When an operation power is failed in the oscillation device 200, the non-volatile memory of the voltage generator 210 may maintain setting parameters related to the adjustment mechanism. After the oscillation device 200 is re-started (e.g., re-powered on), settings of the voltage generator 210 does not have to be refine-tuned by a user (or a system).

Figure 2:
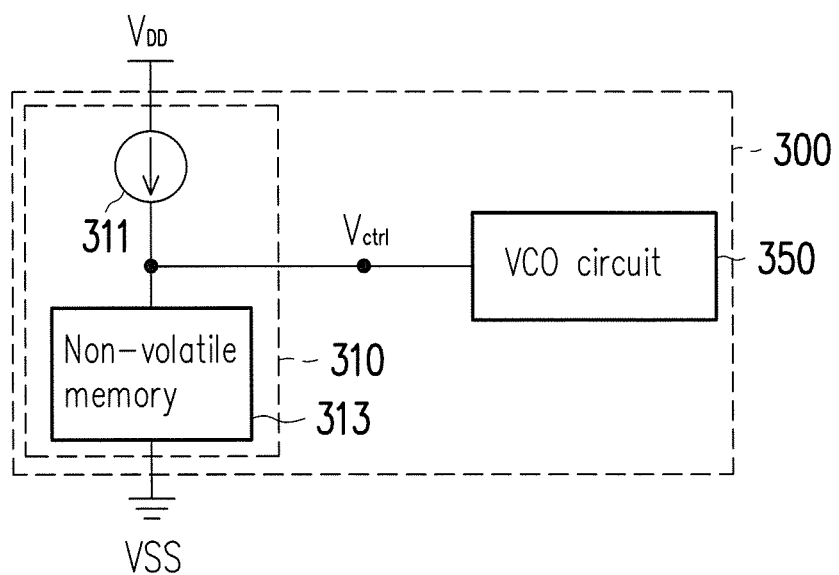
FIG. 2 is a schematic circuit block diagram of an oscillation device according to another embodiment of the invention.

FIG. 2 is a schematic circuit block diagram of an oscillation device 300 according to another embodiment of the invention. The embodiment illustrated in FIG. 2 may be inferred with reference to related description of FIG. 1. Referring to FIG. 2, the oscillation device 300 may include a voltage generator 310 and a VCO circuit 350. The voltage generator 310 may use a non-volatile resistance $R_{out}$ provided by the non-volatile memory 313 to generate a bias voltage $V_{ctrl}$ to the VCO circuit 350. The non-volatile memory 313 may have the non-volatile resistance $R_{out}$ by means of programming. For instance, the non-volatile memory 313 may be programmed based on a digital signal to determine the non-volatile resistance $R_{out}$.

Taking the embodiment illustrated in FIG. 2 as an example, the voltage generator 310 includes a current source 311 and a non-volatile memory 313. The current source 311 is coupled between a system voltage $V_{DD}$ and a first terminal of the non-volatile memory 313, and a second terminal of the non-volatile memory 313 is coupled to a low-level voltage $V_{SS}$ (e.g., a ground voltage). A reference current $I_{ref}$ provided by the current source 311 flows from the first terminal of the non-volatile memory 313 to the second terminal of the non-volatile memory 313. Since the non-volatile resistance $R_{out}$ is between the first terminal and the second terminal of the non-volatile memory 313, the reference current $I_{ref}$ may form a bias voltage $V_{ctrl}$ in the first terminal of the non-volatile memory 313, where the bias voltage $V_{ctrl}=I_{ref}*R_{out}$. Thus, the first terminal of the non-volatile memory 313 may provide the bias voltage $V_{ctrl}$ to control an oscillation frequency of the VCO circuit 350. Thereby, the non-volatile memory 313 may provide the corresponding bias voltage $V_{ctrl}$ through the non-volatile resistance $R_{out}$ and the current source 311 to control the oscillation frequency of the VCO circuit 350.

The non-volatile memory 313 may be implemented in any forms. For instance, in some embodiments, the non-volatile memory 313 may include one or more resistive non-volatile memory (RNVM) cells. The RNVM cells are coupled between the first terminal and the second terminal of the non-volatile memory 313 so as to provide the non-volatile resistance $R_{out}$.

In any case, the voltage generator 310 is not limited to the embodiment illustrated in FIG. 2. For instance, in other embodiments, the current source 311 may be coupled between the low-level voltage $V_{SS}$ (e.g., a ground voltage) and the second terminal of the non-volatile memory 313, and the first terminal of the non-volatile memory 313 is coupled to the system voltage $V_{DD}$. Thereby, the second terminal of the non-volatile memory 313 may provide the bias voltage $V_{ctrl}$ to the VCO circuit 350.

Referring to FIG. 2, the VCO circuit 350 is coupled to the voltage generator 310 and configured to generate a corresponding oscillation frequency based on the bias voltage $V_{ctrl}$. The bias voltage $V_{ctrl}$ is responsive to the non-volatile resistance $R_{out}$ of the non-volatile memory 313 (For example, bias voltage $V_{ctrl}$ can be varied in accordance with the non-volatile resistance $R_{out}$ of the non-volatile memory 313). In other words, when the non-volatile resistance $R_{out}$ of the non-volatile memory 313 is adjusted, the oscillation frequency of the VCO circuit 350 is correspondingly adjusted. When the oscillation device 300 loses the operation power, the resistance state (i.e., the non-volatile resistance $R_{out}$) of the non-volatile memory 313 is not lost. After the oscillation device 300 is re-started (e.g., re-powered on), the non-volatile memory 313 may re-generate and provide the bias voltage $V_{ctrl}$ to the VCO circuit 350 based on the non-volatile resistance $R_{out}$. Moreover, since the resistance state (i.e., the non-volatile resistance $R_{out}$) of the non-volatile memory 313 may be correspondingly set by the user (or the system) according to application requirements, the oscillation frequency output by the oscillation device 300 may be capable of being programmed.

Figure 3:
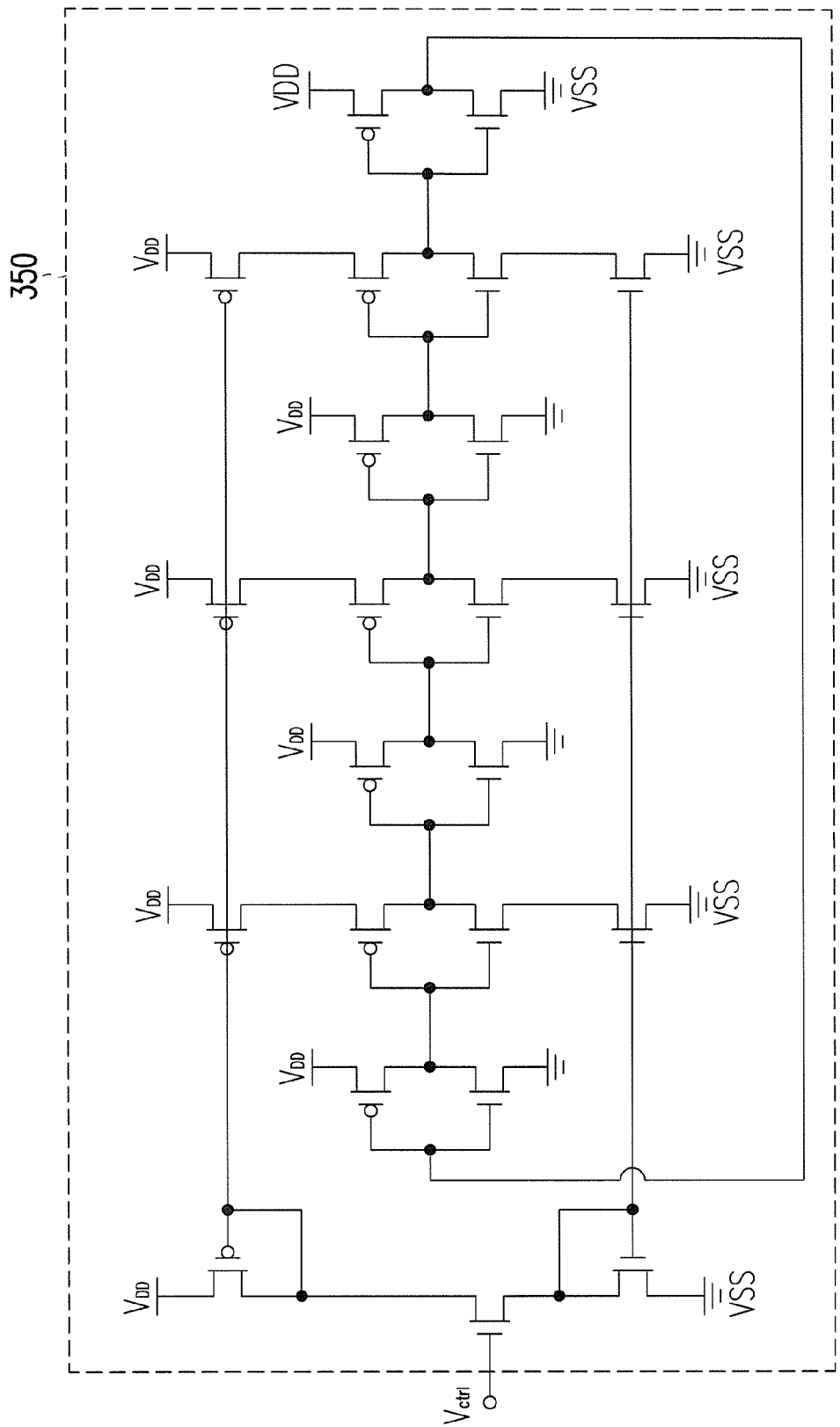
FIG. 3 is a schematic circuit diagram illustrating the voltage-controlled oscillation (VCO) circuit used in the embodiment of FIG. 2 according to an embodiment of the invention.

In the embodiment illustrated in FIG. 2, the VCO circuit 350 may have a ring oscillator or any other type of voltage-controlled oscillator, which is not limited in the invention. A ring oscillator is a feedback network composed of multi-level delay cells and does not have a stable state. The ring oscillator is formed by an odd number of inverters connected in series with the first and the last inverter connected with each other. For instance, FIG. 3 is a schematic circuit diagram illustrating the VCO circuit 350 used in the embodiment of FIG. 2 according to an embodiment of the invention. In the embodiment illustrated in FIG. 3, a ring oscillator formed by seven complementary metal oxide semiconductor (CMOS) inverters connected in series is adopted, but the invention is not intent to limit the number and the type of the inverters. In comparison with an LC oscillator implemented by using an inductor and a capacitor, the ring oscillator has a feature of being small-volumed, which facilitates in miniaturization. An oscillation frequency of the ring oscillator is determined according to the Barkhausen criteria which is well-known to persons with ordinary skills of the art pertaining to the invention and will not repeatedly described hereinafter.

Figure 4:
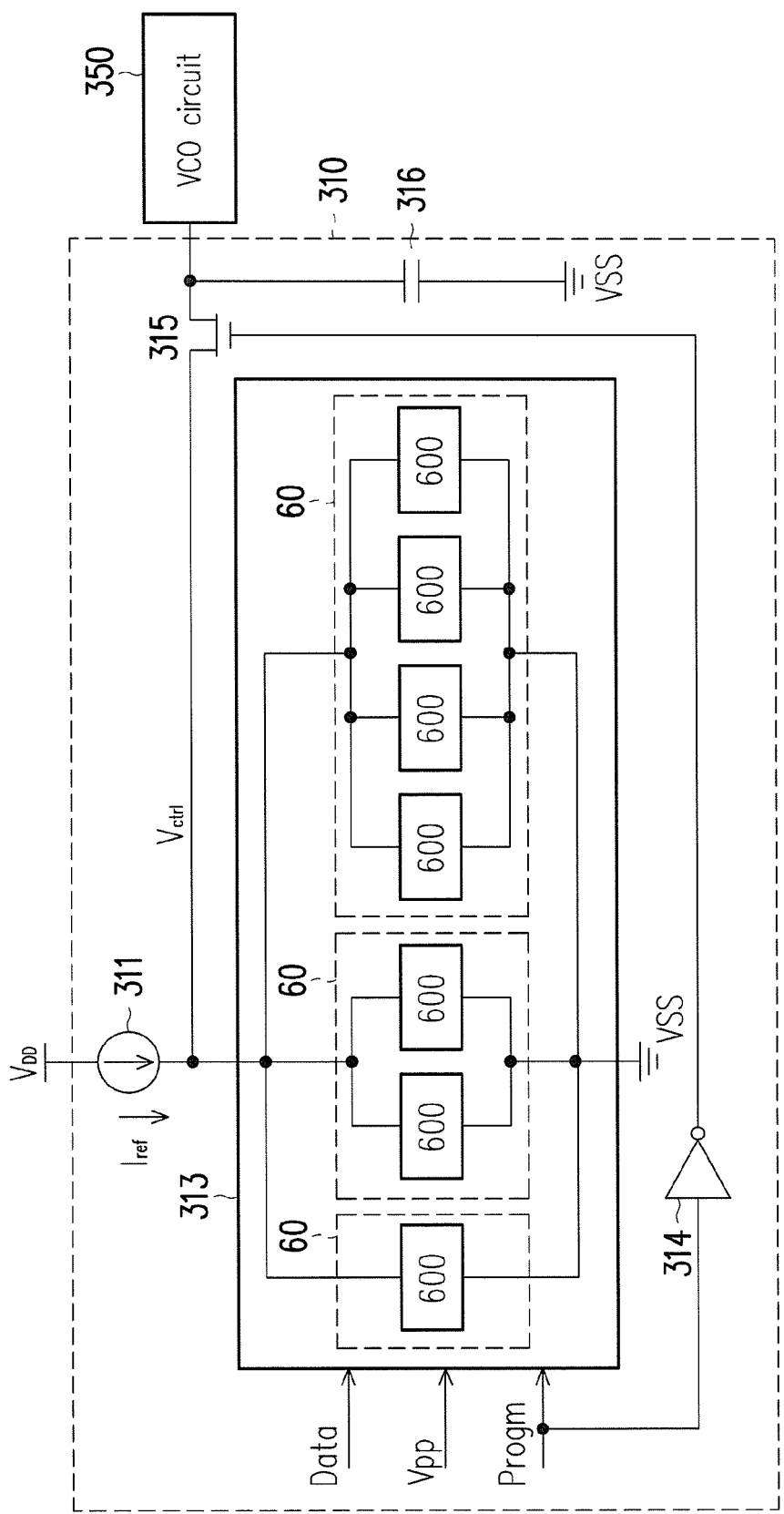
FIG. 4 is a schematic circuit block diagram of an oscillation device according to another embodiment of the invention.

FIG. 4 is a schematic circuit block diagram illustrating the voltage generator 310 and the VCO circuit 350 according to another embodiment of the invention. The embodiment illustrated in FIG. 4 may be inferred with reference to related description of FIG. 2. The voltage generator 310 of the embodiment illustrated in FIG. 4 further includes a NOT gate 314, a switch 315 and a capacitor 316. The NOT gate 314 has an input terminal and an output terminal. Referring to FIG. 4, the input terminal of the NOT gate 314 receives a programming signal Progm. The switch 315 has a control terminal, a first terminal and a second terminal. The switch 315 may be implemented in any form. For example, in the present embodiment, the switch 315 may be an N-type metal oxide semiconductor (NMOS) transistor, while in other embodiments, the switch 315 may be a P-type metal oxide semiconductor (PMOS) transistor, a transmission gate or any other switch element/circuit. The control terminal of the switch 315 is coupled to the output terminal of the NOT gate 314, the first terminal of the switch 315 is coupled to the first terminal of the non-volatile memory 313 to receive the bias voltage $V_{ctrl}$, and the second terminal of the switch 315 is coupled to an input terminal of the VCO circuit 350. The capacitor 316 is coupled between the second terminal of the switch 315 and the low-level voltage $V_{SS}$ (e.g., the ground voltage). In a nominal operation period of the voltage generator 310, the switch 315 is turned on, such that the bias voltage $V_{ctrl}$ provided by the non-volatile memory 313 is transmitted to the capacitor 316 and the VCO circuit 350. In a non-normal operation period (e.g., the programming period) of the voltage generator 310, the switch 315 is turned off, while the capacitor 316 maintains the bias voltage of the VCO circuit 350. Turning off the switch 315 may facilitate in preventing the bias voltage $V_{ctrl}$ from affecting an output frequency of the VCO circuit 350 in the non-normal operation period.

Referring to FIG. 4, in the present embodiment, the non-volatile memory 313 may include one or more resistive non-volatile memory (RNVM) cells 60. Even though in the embodiment of FIG. 4, three RNVM cells 60 connected in parallel are illustrated; however, in other embodiments, the number and the connection manner of the RNVM cells 60 are not limited to the description with respect to FIG. 4, and RNVM cells 60 the number and the connection manner of the RNVM cells 60 can be determined depending on actual product design requirements. The one or more RNVM cells 60 coupled between the first terminal and the second terminal of the non-volatile memory 313 may provide the non-volatile resistance $R_{out}$.

Each of the RNVM cells 60 includes at least one RNVM circuit 600, and the RNVM circuit 600 is coupled between the first terminal and the second terminal of the corresponding RNVM cell 60, as shown in FIG. 4. The RNVM cells 60 have different numbers of RNVM circuits 600, while on another embodiment, the numbers of the RNVM circuits 600 in the RNVM cells 60 are the same. The numbers and the connection manners of the RNVM cells 60 and the RNVM circuits 600 in the RNVM cells 60 may be determined depending on the actual product design requirements, which are not limited in the invention. For instance, the RNVM cells 60 in the non-volatile memory 313 may be connected in series, in parallel or in any combinations of series and parallel as well as the plurality of RNVM circuits 600 in the RNVM cells 60 may be connected in series, in parallel or in any combinations of series and parallel so as to provide the non-volatile resistance $R_{out}$ of the non-volatile memory 313. Examples of embodying the RNVM circuits 600 will be described below.

A plurality of RNVM cells 60 may be connected in parallel between the first terminal and the second terminal of the non-volatile memory 313. For example, referring to FIG. 4, three RNVM cells 60 connected in parallel may respectively have one, two and four RNVM circuits 600 to form a binary-weighted configuration. In another embodiment, the plurality of RNVM cells 60 may also be connected in series between the first terminal and the second terminal of the non-volatile memory 313 (e.g., in a manner illustrated in FIG. 7, which will be described below).

The non-volatile memory 313 may respectively set/adjust an impedance of each RNVM circuit 600 in accordance with inputs of a data signal Data, a programming voltage $V_{pp}$ and the programming signal Progm to change the non-volatile resistance $R_{out}$ of the non-volatile memory 313 so as to change to the oscillation frequency of the VCO circuit 350. For example, if it is assumed that the data signal Data shown in FIG. 4 is a 3-bit signal, the first bit of the data signal Data may be transmitted to each RNVM circuit 600 of the first RNVM cell 60, the second bit of the data signal Data may be transmitted to each RNVM circuit 600 of the second RNVM cell 60, and the third bit of the data signal Data may be transmitted to each RNVM circuit 600 of the third RNVM cell 60. When the programming signal Progm is at a first logic level (e.g., logic "0", indicating that the voltage generator 310 is operated in the normal operation period), the programming operation of the RNVM circuit 600 is disabled. When the programming signal Progm at a second logic level (e.g., logic "1", indicating that the voltage generator 310 is operated in the programming period), each RNVM circuit 600 may be set in a "low-resistance state" or reset in a "high-resistance state" in accordance with a bit corresponding to the data signal Data. A resistance value in the "low-resistance state" is greater than 0 ohm, and a resistance value in the "high-resistance state" is greater than the resistance value of the "low-resistance state".

Figure 5:
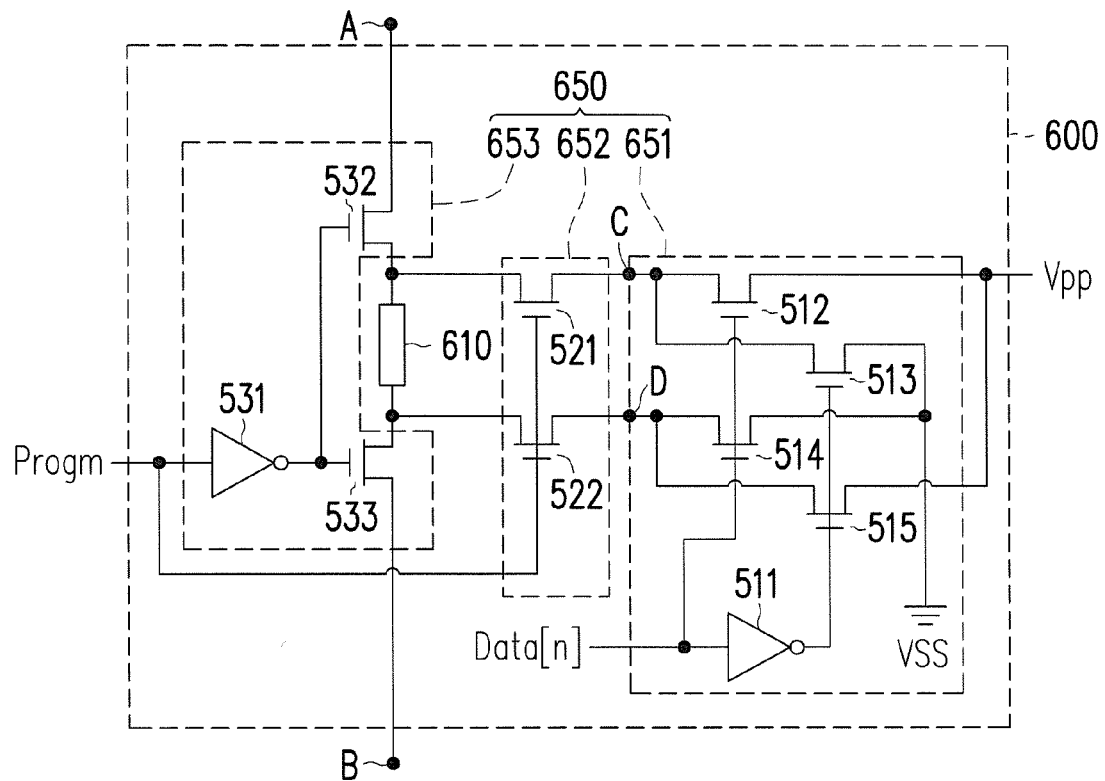
FIG. 5 is a schematic diagram illustrating a circuit structure of a resistive non-volatile memory circuit used in the embodiment of FIG. 4 according to an embodiment of the invention.

FIG. 5 is a schematic diagram illustrating the RNVM circuit 600 used in the embodiment of FIG. 4 according to an embodiment of the invention. Referring to FIG. 5, one RNVM circuit 600 in the RNVM cell 60 includes at least one resistive memory element 610 and a control circuit 650. The resistive memory element 610 may have a first terminal and a second terminal. The control circuit 650 is coupled to the first terminal and the second terminal of the resistive memory element 610 and configured to selectively transmit the programming voltage $V_{pp}$ to the first terminal or the second terminal of the resistive memory element 610 in the programming period or alternatively, selectively couple the first terminal and the second terminal of the resistive memory element 610 to the first terminal (i.e., an endpoint A) and the second terminal (i.e., an endpoint B) of the RNVM circuit 600.

The resistive memory element 610 may be implemented in any manner depending in design requirements. For example, the resistive memory element 610 may include a lower electrode, a variable resistor and an upper electrode. The variable resistor is disposed between the lower electrode and the upper electrode. The lower electrode may be made of a $YBa_2Cu_3O_7$ (YBCO) film or titanium nitride (TiN) or an oxide, a nitride or an oxynitride containing elements selected from manganese, iron, nickel, cobalt, titanium, copper, vanadium and silicon or a combination thereof (e.g., Ti, $SiO_2$, Si and so on). The variable resistor may be made of a Pr1-XCaXMnO$_3$ (PCMO) film, a heterogeneous structure of ZnSe—Ge or a metal oxide associated with Ti, Nb, Hf, Zr, Ta, Ni, V, Zn, Sn, In, Th, Al (e.g., a $HfO_2$ thin film). The upper electrode may be made of an Ag film deposited by sputtering or TiN. A resistance value and a clamp voltage of the resistive memory element 610 vary with the change in the materials and/or manufacturing conditions of the upper electrode, the variable resistor and the lower electrode. By adjusting a voltage direction between and voltage levels of the upper electrode and the lower electrode of the resistive memory element 610, a resistance state of the resistive memory element 610 may be changed, such that a non-volatile impedance of the RNVM circuit 600 may be adjusted.

In the programming period, if the control circuit 650 transmits the programming voltage $V_{pp}$ (i.e., a clamp voltage greater than a voltage of the resistive memory element 610) to the upper electrode of the resistive memory element 610 and transmits a low-level voltage $V_{SS}$ (e.g., a ground voltage) to the lower electrode of the resistive memory element 610, a "setting" operating occurs in the resistive memory element 610, such that the resistance state of the resistive memory element 610 is changed as the low-resistance state. The resistance value of the low-resistance state is greater than hundreds ohms (e.g., several KΩ). Alternatively, in the programming period, if the control circuit 650 transmits the programming voltage $V_{pp}$ to the lower electrode of the resistive memory element 610, and transmits the low-level voltage $V_{SS}$ (e.g., the ground voltage) to the upper electrode of the resistive memory element 610 (means that the upper electrode of the resistive memory element 610 is coupled to the low level voltage Vss), a "resetting" operation occurs in the resistive memory element 610, such that the resistance state of the resistive memory element 610 is changed as the high-resistance state. The resistance value of the high-resistance state is dozens of times more than the resistance value of the low-resistance state (e.g., the resistance value of the high-resistance state can be 10K to 100 MΩ).

However, in different embodiments, operation conditions of the resistive memory element 610 may be different for example, in other embodiments, if the control circuit 650 transmits the programming voltage $V_{pp}$ to the upper electrode of the resistive memory element 610 and transmits the low-level voltage $V_{SS}$ (e.g., the ground voltage) to the lower electrode of the resistive memory element 610, the resistance state of the resistive memory element 610 may probably be changed as the "high-resistance state". If the control circuit 650 transmits the programming voltage $V_{pp}$ to the lower electrode of the resistive memory element 610 and transmits the low-level voltage $V_{SS}$ to the upper electrode of the resistive memory element 610, the resistive memory element 610 may probably be changed as the "low-resistance state".

Referring to FIG. 5, the control circuit 650 includes a switching unit 651, a programming unit 652 and an impedance output unit 653. The switching unit 651 may selectively transmit the programming voltage $V_{pp}$ to a first terminal of the switching unit 651 and transmit a low-level voltage $V_{SS}$ (e.g., a ground voltage or any other constant voltage) to a second terminal of the switching unit 651 according to one corresponding bit Data[n] of the data signal Data. Alternatively, the switching unit 651 may also selectively transmit the programming voltage $V_{pp}$ to the second terminal of the switching unit 651 and transmit the low-level voltage $V_{SS}$ to the first terminal of the switching unit 651 according to the corresponding bit Data[n] of the data signal Data. The programming unit 652 is coupled to a first terminal and a second terminal of the resistive memory element 610 and coupled to the first terminal and the second terminal of the switching unit 651. The programming unit 652 may selectively couple the first terminal and the second terminal of the switching unit 651 respectively to the first terminal and the second terminal of the resistive memory element 610 based on the programming signal Progm in the programming period or alternatively, selectively disconnect the resistive memory element 610 from the switching unit 651 electrically in the normal operation period.

The impedance output unit 653 is coupled between the first terminal of the RNVM circuit 600 and the first terminal of the resistive memory element 610 and coupled between the second terminal of the resistive memory element 610 and the second terminal of the RNVM circuit 600. Based on the programming signal Progm, the impedance output unit 653 may selectively couple the first terminal of the resistive memory element 610 to the first terminal of the RNVM circuit 600 and couple the second terminal of the resistive memory element 610 to the second terminal of the RNVM circuit 600 in the normal operation period. Alternatively, according to the programming signal Progm, the impedance output unit 653 may selectively disconnect electrically the first terminal of the RNVM circuit 600 from the first terminal of the resistive memory element 610 and disconnect electrically the second terminal of the resistive memory element 610 from the second terminal of the RNVM circuit 600 in the programming period.

The switching unit 651 may be implemented in any manner. For example, in the present embodiment, the switching unit 651 includes a NOT gate 511, a transistor 512, a transistor 513, a transistor 514 and a transistor 515. The input terminal of the NOT gate 511 receives one corresponding bit Data[n] of the data signal Data. The transistor 512 has a control terminal, a first terminal and a second terminal, where the control terminal of the transistor 512 is configured to receive the corresponding bit Data[n] of the data signal Data, the first terminal of the transistor 512 is coupled to the first terminal (i.e., an endpoint C) of the switching unit 651, and the second terminal of the transistor 512 is configured to receive the programming voltage $V_{pp}$. The transistor 513 has a control terminal, a first terminal and a second terminal, where the control terminal of the transistor 513 is coupled to the output terminal of the NOT gate 511, the first terminal of the transistor 513 is coupled to the first terminal of the transistor 512, the second terminal of the transistor 513 is configured to receive the low-level voltage $V_{SS}$ (e.g., the ground voltage or any other constant voltage). The transistor 514 has a control terminal, a first terminal and a second terminal, where the control terminal of the transistor 514 is configured to receive one corresponding bit Data[n] of the data signal Data, the first terminal of the transistor 514 is coupled to the second terminal (i.e., an endpoint D) of the switching unit 651, and the second terminal of the transistor 514 is configured to receive the low-level voltage $V_{SS}$. The transistor 515 has a control terminal, a first terminal and a second terminal. The control terminal of the transistor 515 is coupled to the output terminal of the NOT gate 511, the first terminal of the transistor 515 is coupled to the first terminal of the transistor 514, and the second terminal of the transistor 515 is configured to receive the programming voltage $V_{pp}$.

The programming unit 652 may be implemented in any manner. For example, in the present embodiment, the programming unit 652 includes a transistor 521 and a transistor 522. The transistor 521 has a control terminal, a first terminal and a second terminal. The control terminal of the transistor 521 is configured to receive the programming signal Progm, the first terminal of the transistor 521 is coupled to the first terminal of the resistive memory element 610, and the second terminal of the transistor 521 is coupled to the first terminal (i.e., an endpoint C) of the switching unit 651. The transistor 522 has a control terminal, a first terminal and a second terminal, where the control terminal of the transistor 522 is configured to receive the programming signal Progm, the first terminal of the transistor 522 is coupled to the second terminal of the resistive memory element 610, and the second terminal of the transistor 522 is coupled to the second terminal (i.e., an endpoint D) of the switching unit 651.

When the programming signal Progm is at the first logic level (e.g., the logic "0", indicating that the voltage generator 310 is operated in the normal operation period), the transistors 521 and 522 is turned off, such that the programming operation of the RNVM circuit 600 is disabled. When the programming signal Progm is at the second logic level (e.g., the logic "1", indicating that the voltage generator 310 is operated in the programming period), the transistors 521 and 522 are turned on. In the programming period, when the corresponding bit Data[n] is at the first logic level (e.g., the logic "0"), the transistors 512 and 514 are turned off, and the transistors 513 and 515 are turned on. In this case, the low-level voltage $V_{SS}$ (e.g., the ground voltage) is transmitted to the first terminal of the resistive memory element 610 through the transistor 513 and the transistor 521, and the programming voltage $V_{pp}$ is transmitted to the second terminal of the resistive memory element 610 through the transistor 515 and the transistor 522. Thus, the "resetting" operation occurs in the resistive memory element 610, such that the resistance state of the resistive memory element 610 is changed as the high-resistance state. When the corresponding bit Data[n] is at the second logic level (e.g., the logic "1"), the transistors 512 and 514 are turned on, and the transistors 513 and 515 are turned off. In this case, the programming voltage $V_{pp}$ is transmitted to the first terminal of the resistive memory element 610 through the transistor 512 and the transistor 521, and the low-level voltage $V_{SS}$ (e.g., the ground voltage) is transmitted to the second terminal of the resistive memory element 610 through the transistor 514 and the transistor 522. Thus, the "setting" operation occurs in the resistive memory element 610, such that the resistance state of the resistive memory element 610 is changed as the low-resistance state.

However, the present embodiment is not limited to the context set forth above. For instance, in other embodiments, the transistors 512 through 515 or the transistors 521 through 522 may be PMOS transistors. In one embodiment of the invention, when the transistors 512 through 515 are PMOS transistors, the input terminal of the NOT gate 511 receives one corresponding bit Data[n] of the data signal Data, the output terminal of the NOT gate 511 is coupled to the control terminals of the transistors 512 and 514, and the control terminals of the transistors 513 and 515 receives the corresponding bit Data[n]. In the programming period, when the corresponding bit Data[n] is the logic "0", the transistors 512 and 514 are turned off, and the transistors 513 and 515 are turned on. In this case, the low-level voltage $V_{SS}$ (e.g., the ground voltage) is transmitted to the first terminal of the resistive memory element 610 through the transistor 513 and the transistor 521, and the programming voltage $V_{pp}$ is transmitted to the second terminal of the resistive memory element 610 through the transistor 515 and the transistor 522. When the corresponding bit Data[n] is the logic "1", the transistors 512 and 514 are turned on, and the transistors 513 and 515 are turned off. In this case, the programming voltage $V_{pp}$ is transmitted to the first terminal of the resistive memory element 610 through the transistor 512 and the transistor 521, and the low-level voltage $V_{SS}$ (e.g., the ground voltage) is transmitted to the second terminal of the resistive memory element 610 through the transistor 514 and the transistor 522.

The impedance output unit 653 may be implemented in any manner. For instance, in the present embodiment, the impedance output unit 653 includes a NOT gate 531, a transistor 532 and a transistor 533. The NOT gate 531 has an input terminal and an output terminal, where the input terminal of the NOT gate 531 receives the programming signal Progm. The transistor 532 has a control terminal, a first terminal and a second terminal, where the control terminal of the transistor 532 is coupled to the output terminal of the NOT gate 531, the first terminal of the transistor 532 is coupled to the first terminal of the RNVM circuit 600, and the second terminal of the transistor 532 is coupled to the first terminal of the resistive memory element 610. The transistor 533 has a control terminal, a first terminal and a second terminal, where the control terminal of the transistor 533 is coupled to the output terminal of the NOT gate 531, the first terminal of the transistor 533 is coupled to the second terminal of the resistive memory element 610, and the second terminal of the transistor 533 is coupled to the second terminal of the RNVM circuit 600.

When the programming signal Progm is at the first logic level (e.g., the logic "0", indicating that the voltage generator 310 is operated in the normal operation period), the programming operation of the RNVM circuit 600 is disabled, and the transistors 532 and 533 are turned on. In this case, the resistive memory element 610 may be connected in series (or in parallel) with the other RNVM circuits in the RNVM cell 60. When the programming signal Progm is at the second logic level (e.g., the logic "1", indicating that the voltage generator 310 is operated in the programming period), the programming operation of the RNVM circuit 600 is enabled, and the transistors 532 and 533 are turned off. Due to the transistors 532 and 533 being turned off, the programming voltage $V_{pp}$ does not cause any affection to the output frequency of the VCO circuit 350. However, the present embodiment is not limited to the context set forth above. For example, in other embodiments, the transistors 532 and 533 may be PMOS transistors, and the NOT gate 531 may be omitted. In the scenario that the NOT gate 531 is omitted, gates of the transistors 532 and 533 may receive the programming signal Progm. If the programming signal Progm is at the first logic level (e.g., the logic "0", indicating that the voltage generator 310 is operated in the normal operation period), the transistors 532 and 533 are turned on, and the programming operation of the RNVM circuit 600 is disabled. When the programming signal Progm is at the second logic level (e.g., the logic "1", indicating that the voltage generator 310 is operated in the programming period), the transistors 532 and 533 are turned off, and the programming operation of the RNVM circuit 600 is enabled.

Figure 6:
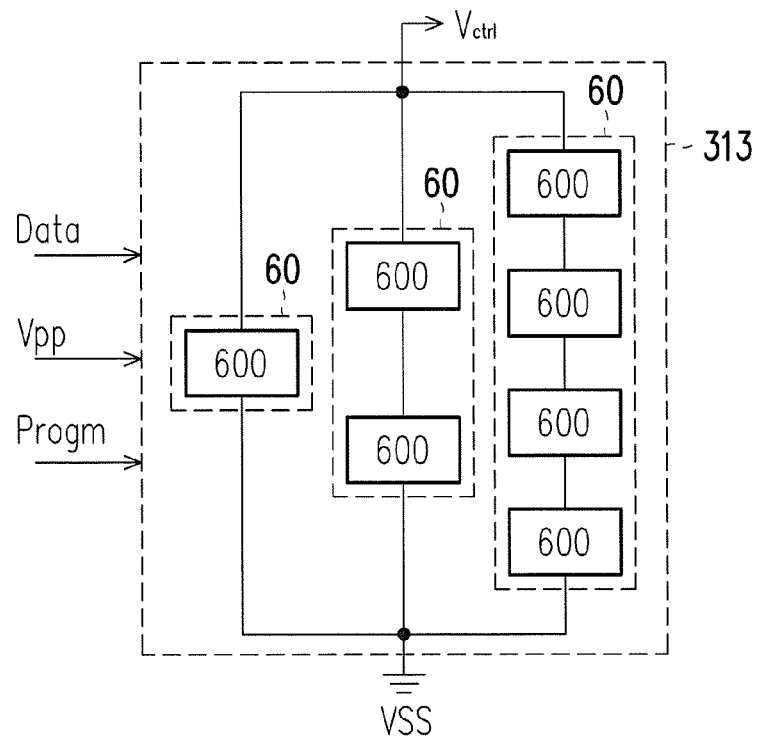
FIG. 6 is a schematic diagram illustrating an arrangement pattern of the resistive non-volatile memory circuit in the non-volatile memory used in the embodiment of FIG. 2 or FIG. 4 according to another embodiment of the invention.

FIG. 6 is a schematic diagram illustrating an arrangement pattern of the RNVM circuit 600 in the non-volatile memory 313 used in the embodiment of FIG. 2 or FIG. 4 according to another embodiment of the invention. The embodiment illustrated in FIG. 6 may be inferred with reference to the related descriptions of FIG. 2, FIG. 4 and FIG. 5. In the embodiment illustrated in FIG. 6, the RNVM circuits 600 in the RNVM cells 60 may be connected in parallel. Taking the embodiment illustrated in FIG. 6 as an example, if it is assumed that the data signal Data is a 3-bit signal, the first bit of the data signal Data is transmitted to each RNVM circuit 600 of the first RNVM cell 60, the second bit of the data signal Data is transmitted to each RNVM circuit 600 of the second RNVM cell 60, and the third bit of the data signal Data is transmitted to each RNVM circuit 600 of the third RNVM cell 60. When the programming signal Progm indicates that the voltage generator 310 is operated in the programming period, each RNVM circuit 600 may be set in the "low-resistance state" or may be reset in the "high-resistance state" in accordance with a corresponding bit of the data signal Data. When the programming signal Progm indicates that the voltage generator 310 is operated in the normal operation period, the programming operation of the RNVM circuits 600 is disabled.

Figure 7:
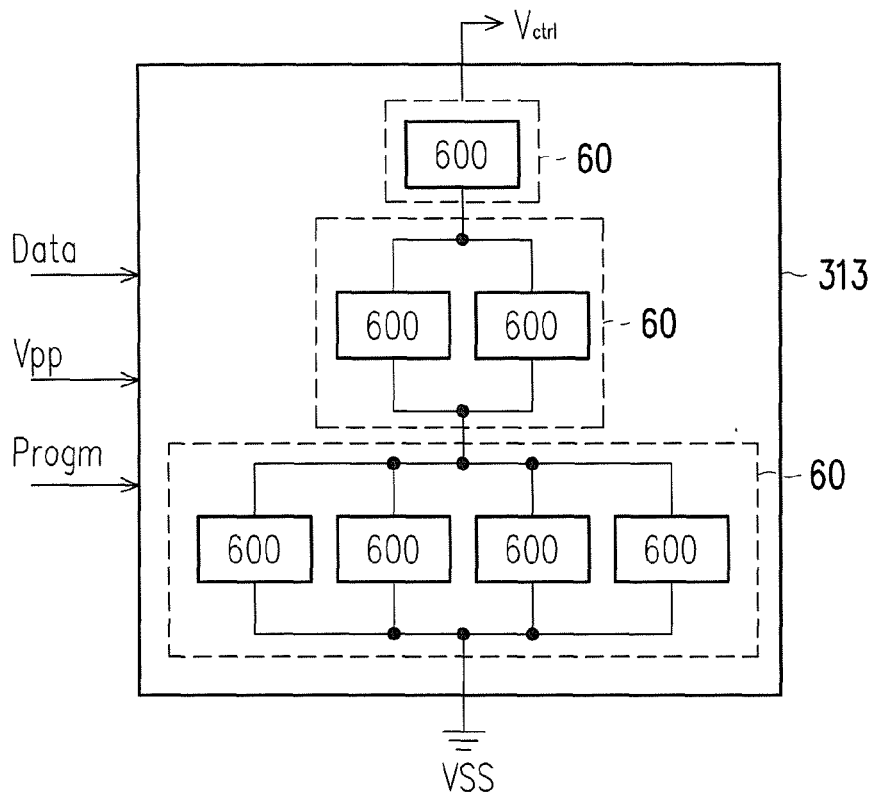
FIG. 7 is a schematic diagram illustrating an arrangement pattern of the resistive non-volatile memory circuit in the non-volatile memory used in the embodiment of FIG. 2 or FIG. 4 according to yet another embodiment of the invention.

FIG. 7 is a schematic diagram illustrating an arrangement pattern of the RNVM circuit 600 in the non-volatile memory 313 used in the embodiment of FIG. 2 or FIG. 4 according to yet another embodiment of the invention. The embodiment illustrated in FIG. 7 may be inferred with reference to the related descriptions of FIG. 2, FIG. 4 and FIG. 5. In the embodiment illustrated in FIG. 7, the RNVM circuits 600 in the RNVM cell 60 may be connected in series. Referring to FIG. 7, when the programming signal Progm indicates that the voltage generator 310 is operated in the programming period, each RNVM circuit 600 may be set in the "low-resistance state" or may be reset in the "high-resistance state" in accordance with a corresponding bit of the data signal Data. When the programming signal Progm indicates that the voltage generator 310 is operated in the normal operation period, the programming operation of the RNVM circuits 600 is disabled.

Figure 8:
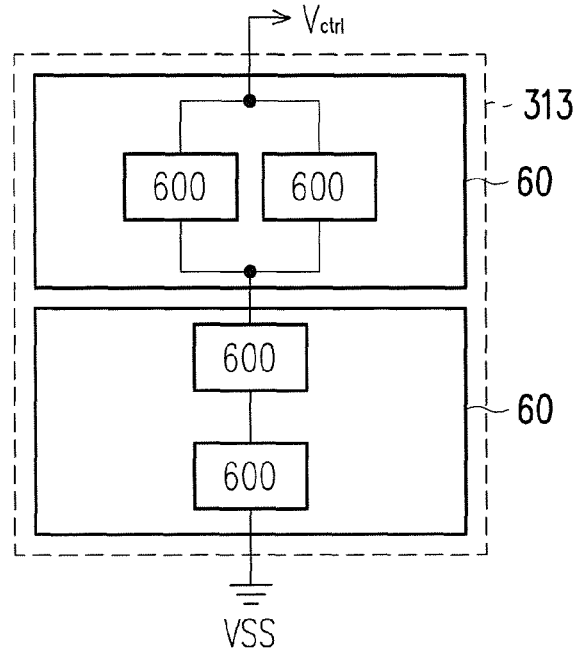
FIG. 8 is a schematic diagram illustrating an arrangement pattern of the resistive non-volatile memory circuit in the non-volatile memory used in the embodiment of FIG. 2 or FIG. 4 according to still another embodiment of the invention.

FIG. 8 is a schematic diagram illustrating an arrangement pattern of the RNVM circuit 600 in the non-volatile memory 313 used in the embodiment of FIG. 2 or FIG. 4 according to yet another embodiment of the invention. The embodiment illustrated in FIG. 8 may be inferred with reference to the related descriptions of FIG. 2, FIG. 4, FIG. 5, FIG. 6 and FIG. 7. In the embodiment illustrated in FIG. 8, the RNVM circuits 600 in a portion of the RNVM cells 60 are connected in series, while the RNVM circuits 600 in the other portion of the RNVM cells 60 are connected in parallel. With the arrangement pattern illustrated with reference to FIG. 4, FIG. 6 through FIG. 8, for example, the required non-volatile resistance $R_{out}$ according to the user's demand can be obtained.

Figure 9:
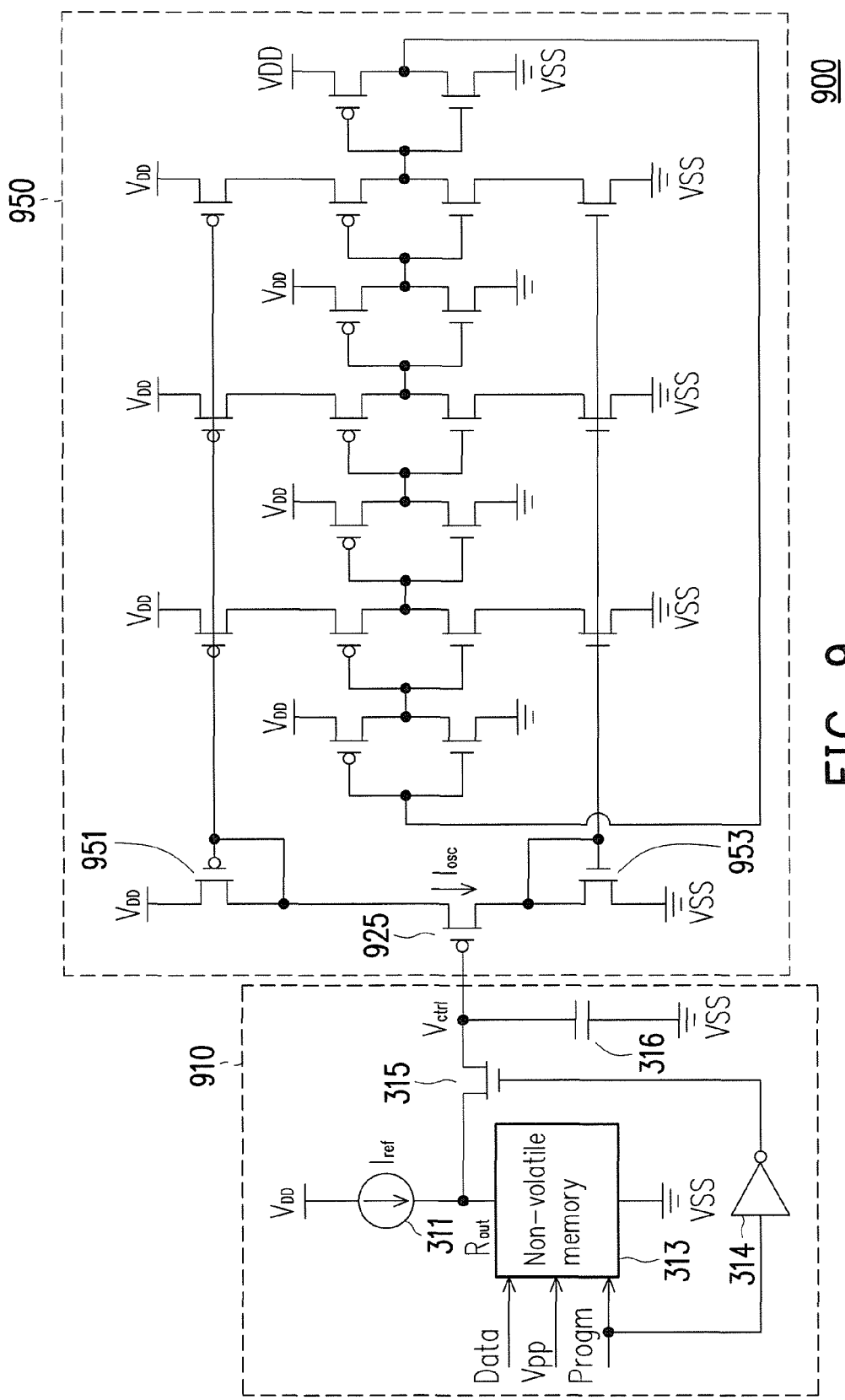
FIG. 9 is a schematic circuit diagram of an oscillation device according to another embodiment of the invention.

FIG. 9 is a schematic circuit diagram of an oscillation device 900 according to another embodiment of the invention. In the embodiment illustrated in FIG. 9, the oscillation device 900 includes a voltage generator 910 and a VCO circuit 950. The voltage generator 910 and the VCO circuit 950 illustrated in FIG. 9 may be inferred with reference to the related descriptions of the voltage generator 210 and the VCO circuit 250 depicted in FIG. 1 and may also be inferred with reference to the related descriptions of the voltage generator 310 and the VCO circuit 350 depicted in FIG. 2 through FIG. 8.

Referring to FIG. 9, the voltage generator 910 includes a current source 311, a non-volatile memory 313, a NOT gate 314, a switch 315 and a capacitor 316. The first terminal and the second terminal of the non-volatile memory 313 are respectively coupled to the current source 311 and a low-level voltage $V_{SS}$ (e.g., a ground voltage). A reference current $I_{ref}$ provided by the current source 311 may flow from the first terminal of the non-volatile memory 313 to the second terminal of the non-volatile memory 313. Due to a non-volatile resistance $R_{out}$ between the first terminal and the second terminal of the non-volatile memory 313, the reference current $I_{ref}$ may form a bias voltage $V_{ctrl}$ at the first terminal of the non-volatile memory 313, where the bias voltage $V_{ctrl}=I_{ref}*R_{out}$. Thus, the first terminal of the non-volatile memory 313 may provide the bias voltage $V_{ctrl}$ to control an oscillation frequency of the VCO circuit 950.

In the present embodiment, the switch 315 may be an NMOS transistor, while in other embodiments, the switch 315 may be a PMOS transistor, a transmission gate or any other switch element/circuit. In a normal operation period of the voltage generator 910, the switch 315 is turned on so as to transmit the bias voltage $V_{ctrl}$ provided by the non-volatile memory 313 to the capacitor 316 and the VCO circuit 950. In a non-normal operation period (e.g., a programming period) of the voltage generator 910, the switch 315 is turned off while the capacitor 316 maintains the bias voltage $V_{ctrl}$ of the VCO circuit 950. Turning off the switch 315 may facilitate in preventing the voltage of the first terminal of the non-volatile memory 313 from affecting the output frequency of the VCO circuit 950 in the non-normal operation period.

In the embodiment illustrated in FIG. 9, a ring oscillator formed by seven CMOS inverters connected in series is adopted for the VCO circuit 950; however, the number and the type of the inverters of other embodiments of the invention shall not be limited the illustration of FIG. 9. An oscillation frequency of the ring oscillator is determined according to the Barkhausen criteria which is well-known to persons with ordinary skills of the art pertaining to the invention and will not repeatedly described hereinafter. In addition to the ring oscillator, the VCO circuit 950 further includes a PMOS transistor 951, a PMOS transistor 925 and an NMOS transistor 953. The PMOS transistor 925 may determine a current $I_{osc}$ based on the control of the bias voltage $V_{ctrl}$. The PMOS transistor 951 and the NMOS transistor 953 may mirror the current $I_{osc}$ to part of (or all of) the CMOS inverters in the ring oscillator shown in FIG. 9. Thereby, the bias voltage $V_{ctrl}$ may control the oscillation frequency of the VCO circuit 950. In an embodiment, the size of the current $I_{osc}$ and the number of the inverters may cause affection to the oscillation frequency of the VCO circuit 950. According to the description above, the PMOS transistor 925 may determine the current $I_{osc}$ based on the control of the bias voltage $V_{ctrl}$, and the greater the $I_{osc}$, the higher the oscillation frequency. Moreover, with the increase of the number of the inverters, transmission time of the signal is delayed, such that the oscillation frequency of the VCO circuit 950 may be changed.

Figure 10:
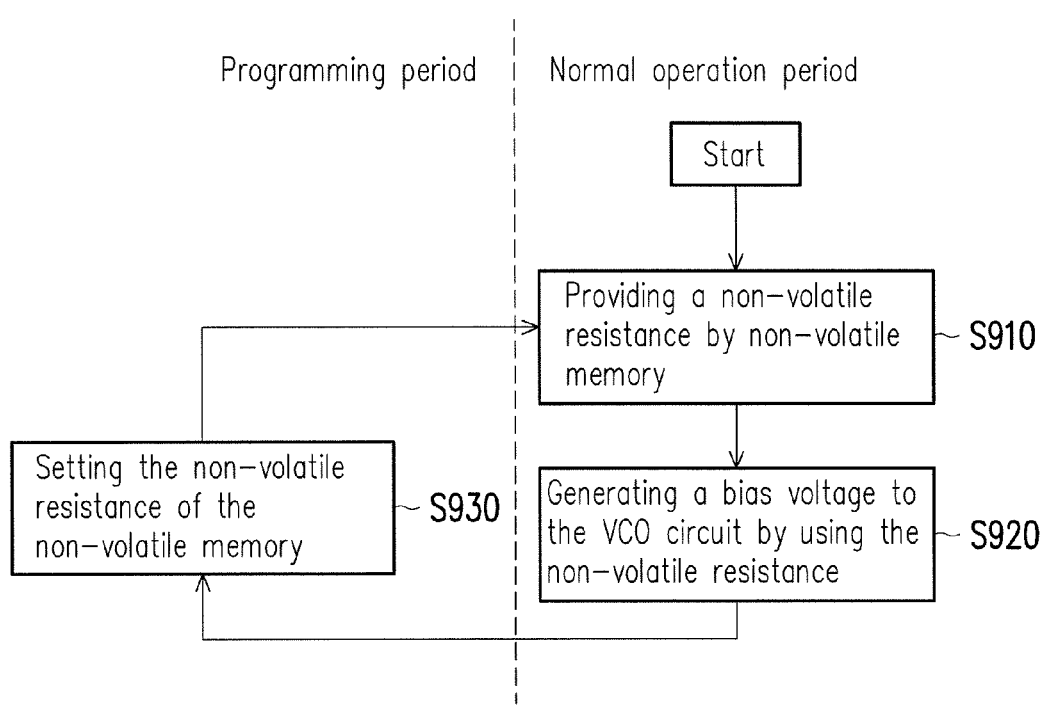
FIG. 10 is a schematic flowchart of an operation method of a VCO circuit according to an embodiment of the invention.

FIG. 10 is a schematic flowchart of an operation method of a VCO circuit according to an embodiment of the invention. Related description of FIG. 10 may be applicable to the embodiment illustrated in FIG. 2 or FIG. 4. Referring to FIG. 2 and FIG. 10, when the oscillation device 300 is powered on, the voltage generator 310 enters the normal operation period, and step S910 is performed, such that the non-volatile resistance $R_{out}$ is provided by the at least one non-volatile memory 313. In step S920, the current source 311 provides the reference current $I_{ref}$ to the non-volatile memory 313. Due to the non-volatile resistance $R_{out}$ between the first terminal and the second terminal of the non-volatile memory 313, the reference current $I_{ref}$ forms the bias voltage $V_{ctrl}$ at the first terminal of the non-volatile memory 313, where the bias voltage $V_{ctrl}=I_{ref}*R_{out}$. Thereby, the non-volatile memory 313 may generate the bias voltage $V_{ctrl}$ to the VCO circuit 350 by using the non-volatile resistance $R_{out}$. In the programming period, in step S930, the non-volatile memory 313 sets the non-volatile resistance $R_{out}$ of the non-volatile memory 313 to adjust the bias voltage $V_{ctrl}$ so as to control the VCO circuit 350 to generate a corresponding oscillation frequency based on the bias voltage $V_{ctrl}$.

Taking the embodiment illustrated in FIG. 4 as an example, a plurality of RNVM cells 60 is provided between the first terminal and the second terminal of the non-volatile memory 313 so as to provide the non-volatile resistance $R_{out}$. The non-volatile memory 313 may respectively set a resistance state of a plurality of RNVM circuits 600 to determine the non-volatile resistance $R_{out}$ of the non-volatile memory 313. In the normal operation period, the current source 311 provides the current $I_{ref}$ to the non-volatile memory 313, such that the non-volatile memory 313 correspondingly generates the bias voltage $V_{ctrl}$ based on the non-volatile resistance $R_{out}$. The bias voltage $V_{ctrl}$ provided by the first terminal of the non-volatile memory 313 is transmitted to the capacitor 316 and the VCO circuit 350 through the switch 315 to control the VCO circuit 350 to generate the corresponding oscillation frequency. In other words, the bias voltage $V_{ctrl}$ is responsive to the non-volatile resistance $R_{out}$ (for example, the bias voltage $V_{ctrl}$ can be varied in accordance with the non-volatile resistance $R_{out}$).

When the non-volatile resistance $R_{out}$ of the non-volatile memory 313 is adjusted, the oscillation frequency of the VCO circuit 350 is correspondingly changed. In the programming period, the resistance state of each RNVM cell 60 may be set to determine the non-volatile resistance $R_{out}$ of the non-volatile memory 313 so as to change the bias voltage $V_{ctrl}$. During the period of the bias voltage $V_{ctrl}$ being changed, the switch 315 is in an off state. During the period of the switch 315 being turned off, the capacitor 316 may main the bias voltage of the VCO circuit 350.

To sum up, in the oscillation device 300 provided by the embodiments of the invention, the non-volatile resistance $R_{out}$ previously set in the non-volatile memory 313 can be retained even though after a re-start up process for the usage convenience of the user, without refine-tuning the non-volatile resistance $R_{out}$, and thus, no external memory device has to be additionally connected for storing the digital value of the non-volatile resistance. Moreover, the operation method of the VCO circuit 350 proposed by the embodiments of the invention can facilitate in providing stable oscillation frequency.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An oscillation device, comprising:
   at least one non-volatile memory;
   a voltage generator, comprising a current source for providing a current flowing through the at least one non-volatile memory, for generating a bias voltage by using a non-volatile resistance of the at least one non-volatile memory; and
   a voltage-controlled oscillation (VCO) circuit, coupled to the voltage generator and configured to generate a corresponding oscillation frequency based on the bias voltage,
   wherein the non-volatile resistance of the at least one non-volatile memory is set independently from the current provided by the current source to adjust the bias voltage,
   wherein the non-volatile memory is located in the voltage generator, a first terminal and a second terminal of the non-volatile memory are respectively coupled to the current source and a low-level voltage,
   wherein the non-volatile memory comprises at least one resistive non-volatile memory (RNVM) cell coupled between the first terminal and the second terminal of the non-volatile memory so as to provide the non-volatile resistance,
   wherein the first terminal of the non-volatile memory provides the bias voltage,
   wherein the voltage generator further comprises:
      a NOT gate, having an input terminal and an output terminal, and the input terminal of the NOT gate receiving a programming signal;
      a switch, having a control terminal, a first terminal and a second terminal, the control terminal of the switch being coupled to the output terminal of the NOT gate, the first terminal of the switch being coupled to the first terminal of the non-volatile memory to receive the bias voltage and the second terminal of the switch being coupled to an input terminal of the VCO circuit; and
      a capacitor, coupled between the second terminal of the switch and a low-level voltage, wherein during a non-normal operation period, the switch is turned off while the capacitor maintains the bias voltage.

2. The oscillation device according to claim 1, wherein the non-volatile memory is a resistive random access memory or a phase-change random access memory.

3. The oscillation device according to claim 1, wherein the non-volatile resistance of the non-volatile memory is determined by a programming process utilizing a digital signal, and the bias voltage is generated in accordance with the non-volatile resistance and the current provided by the current source.

4. The oscillation device according to claim 1, wherein the bias voltage is varied in accordance with the non-volatile resistance of the non-volatile memory.

5. The oscillation device according to claim 1, wherein the RNVM cells are connected in series or in parallel between the first terminal and the second terminal of the non-volatile memory.

6. The oscillation device according to claim 5, wherein each of the RNVM cells comprises at least one RNVM circuit, and the at least one RNVM circuit is connected in series or in parallel in one of the RNVM cells.

7. The oscillation device according to claim 1, wherein each of the RNVM cells comprises at least one RNVM circuit, and any one of the RNVM circuits comprises:
   a resistive memory element, having a first terminal and a second terminal; and
   a control circuit, coupled to the first terminal and the second terminal of the resistive memory element and configured to selectively transmit a programming voltage to the first terminal or the second terminal of the resistive memory element in a programming period, or selectively couple the first terminal and the second terminal of the resistive memory element to a first terminal and a second terminal of the RNVM circuit respectively in a normal operation period.

8. The oscillation device according to claim 7, wherein the control circuit comprises:
   a switching unit, selectively transmitting the programming voltage to a first terminal of the switching unit and transmitting a low-level voltage to a second terminal of the switching unit, or selectively transmitting the programming voltage to the second terminal of the switching unit and transmitting the low-level voltage to the first terminal of the switching unit, in accordance with a data signal;
   a programming unit, coupled to the first terminal and the second terminal of the resistive memory element and the switching unit, and configured to based on a programming signal, selectively couple the first terminal and the second terminal of the switching unit to the first terminal and the second terminal of the resistive memory element respectively in the programming period or selectively disconnect electrically the resistive memory element from the switching unit in the normal operation period; and
   an impedance output unit, coupled between the first terminal of the RNVM circuit and the first terminal of the resistive memory element, coupled between the second terminal of the resistive memory element and the second terminal of the RNVM circuit, and configured to based on the programming signal, couple the first terminal of the resistive memory element to the first terminal of the RNVM circuit and couple the second terminal of the resistive memory element to the second terminal of the RNVM circuit in the normal operation period or eclectically disconnect the first terminal of the RNVM circuit from the first terminal of the resistive memory element and electrically disconnect the second terminal of the resistive memory element from the second terminal of the RNVM circuit in the programming period.

9. A voltage generator, comprising:

a current source, providing a current;

a non-volatile memory, having a first terminal and a second terminal respectively coupled to the current source and a low-level voltage, having a non-volatile resistance determined by a programming process, and generating a bias voltage in accordance with the non-volatile resistance and the current, wherein the current flowing through the non-volatile memory, a NOT gate, having an input terminal and an output terminal, and the input terminal of the NOT gate receiving a programming signal;

a switch, having a control terminal, a first terminal and a second terminal, the control terminal of the switch being coupled to the output terminal of the NOT gate, the first terminal of the switch being coupled to the first terminal of the non-volatile memory to receive the bias voltage, and the second terminal of the switch being coupled to an input terminal of a voltage-controlled oscillation circuit; and a capacitor, coupled between the second terminal of the switch and a low-level voltage, wherein during a non-normal operation period, the switch is turned off while the capacitor maintains the bias voltage, wherein the non-volatile resistance of the at least one non-volatile memory is set independently from the current provided by the current source to adjust the bias voltage.

10. The voltage generator according to claim 9, wherein the non-volatile resistance of the non-volatile memory is determined by the programming process utilizing a digital signal.

11. The voltage generator according to claim 9, wherein the non-volatile memory comprises:

at least one resistive non-volatile memory (RNVM) cell, coupled between the first terminal and the second terminal of the non-volatile memory so as to provide the non-volatile resistance.

12. The voltage generator according to claim 11, wherein each of the RNVM cells comprises at least one RNVM circuit, and any one of the RNVM circuits comprises:

a resistive memory element, having a first terminal and a second terminal; and a control circuit, coupled to the first terminal and the second terminal of the resistive memory element, and configured to selectively transmit a programming voltage to the first terminal or the second terminal of the resistive memory element in a programming period, or selectively couple the first terminal and the second terminal of the resistive memory element to a first terminal and a second terminal of the RNVM circuit respectively in a normal operation period.

13. The voltage generator according to claim 12, wherein the control circuit comprises:

a switching unit, selectively transmitting the programming voltage to a first terminal of the switching unit and transmitting a low-level voltage to a second terminal of the switching unit or selectively transmitting the programming voltage to the second terminal of the switching unit and transmitting the low-level voltage to the first terminal of the switching unit, in accordance with a data signal;

a programming unit, coupled to the first terminal and the second terminal of the resistive memory element and the switching unit, and configured to based on a programming signal, selectively couple the first terminal and the second terminal of the switching unit respectively to the first terminal and the second terminal of the resistive memory element in the programming period or selectively disconnect electrically the resistive memory element from the switching unit in the normal operation period; and an impedance output unit, coupled between the first terminal of the RNVM circuit and the first terminal of the resistive memory element, coupled between the second terminal of the resistive memory element and the second terminal of the RNVM circuit, and configured to based on the programming signal, couple the first terminal of the resistive memory element to the first terminal of the RNVM circuit and couple the second terminal of the resistive memory element to the second terminal of the RNVM circuit in the normal operation period or eclectically disconnect the first terminal of the RNVM circuit from the first terminal of the resistive memory element and electrically disconnect the second terminal of the resistive memory element from the second terminal of the RNVM circuit in the programming period.

14. The voltage generator according to claim 13, wherein the switching unit comprises:

a NOT gate, having an input terminal and an output terminal, and the input terminal of the NOT gate receiving a data signal;

a first transistor, having a control terminal, a first terminal and a second terminal, the control terminal of the first transistor being configured to receive the data signal, the first terminal of the first transistor being coupled to the first terminal of the switching unit, and the second terminal of the first transistor being configured to receive the programming voltage;

a second transistor, having a control terminal, a first terminal and a second terminal, the control terminal of the second transistor being coupled to the output terminal of the NOT gate, the first terminal of the second transistor being coupled to the first terminal of the first transistor, and the second terminal of the second transistor being configured to receive the low-level voltage;

a third transistor, having a control terminal, a first terminal and a second terminal, the control terminal of the third transistor being configured to receive the data signal, the first terminal of the third transistor being coupled to the second terminal of the switching unit, and the second terminal of the third transistor being configured to receive the low-level voltage; and a fourth transistor, having a control terminal, a first terminal and a second terminal, the control terminal of the fourth transistor being coupled to the output terminal of the NOT gate, the first terminal of the fourth transistor being coupled to the first terminal of the third transistor, and the second terminal of the fourth transistor being configured to receive the programming voltage.

15. The voltage generator according to claim 13, wherein the programming unit comprises:

a first transistor, having a control terminal, a first terminal and a second terminal, the control terminal of the first transistor being configured to receive the programming signal, the first terminal of the first transistor being coupled to the first terminal of the resistive memory element, and the second terminal of the first transistor being coupled to the first terminal of the switching unit; and a second transistor, having a control terminal, a first terminal and a second terminal, the control terminal of the second transistor being configured to receive the programming signal, the first terminal of the second transistor being coupled to the second terminal of the resistive memory element, the second terminal of the second transistor being coupled to the second terminal of the switching unit.

16. The voltage generator according to claim 13, wherein the impedance output unit comprises:

a NOT gate, having an input terminal and an output terminal, and the input terminal of the NOT gate receiving the programming signal;

a first transistor, having a control terminal, a first terminal and a second terminal, the control terminal of the first transistor being coupled to the output terminal of the NOT gate, the first terminal of the first transistor being coupled to the first terminal of the RNVM circuit, and the second terminal of the first transistor being coupled to the first terminal of the resistive memory element; and a second transistor, having a control terminal, a first terminal and a second terminal, the control terminal of the second transistor being coupled to the output terminal of the NOT gate, the first terminal of the second transistor being coupled to the second terminal of the resistive memory element, and the second terminal of the second transistor being coupled to the second terminal of the RNVM circuit.

* * * * *